United States Patent [19]
Lou et al.

[11] Patent Number: 5,597,754
[45] Date of Patent: Jan. 28, 1997

[54] INCREASED SURFACE AREA FOR DRAM, STORAGE NODE CAPACITORS, USING A NOVEL POLYSILICON DEPOSITION AND ANNEAL PROCESS

[75] Inventors: Chine-Gie Lou; Yu-Hua Lee, both of Hsinchu, Taiwan

[73] Assignee: Industrial Technology Research Institute, Hsinchu, Taiwan

[21] Appl. No.: 450,299

[22] Filed: May 25, 1995

[51] Int. Cl.[6] .................... H01L 21/70; H01L 27/00
[52] U.S. Cl. ................. 437/52; 437/60; 437/919
[58] Field of Search ................... 437/977, 52, 60, 437/919; 148/DIG. 138

[56] References Cited

U.S. PATENT DOCUMENTS

| | | |
|---|---|---|
| 5,278,091 | 1/1994 | Fazan et al. ................. 437/52 |
| 5,286,668 | 2/1994 | Chou ......................... 437/52 |
| 5,290,729 | 3/1994 | Hayashide et al. ............ 437/60 |
| 5,366,917 | 11/1994 | Watanabe et al. ............ 437/47 |
| 5,407,534 | 4/1995 | Thakur ....................... 156/662 |

*Primary Examiner*—Jey Tsai
*Attorney, Agent, or Firm*—George O. Saile

[57] ABSTRACT

A process for fabricating a stacked capacitor, DRAM, device, with an optimized lower electrode structure, has been developed. The surface area of the lower electrode has been increased by using a specific polysilicon deposition process, featuring the use of Si2H6, followed by specific insitu anneals, initially in nitrogen, and then in a vacuum.

20 Claims, 4 Drawing Sheets

INCREASED SURFACE AREA FOR DRAM, STORAGE NODE CAPACITORS, USING A NOVEL POLYSILICON DEPOSITION AND ANNEAL PROCESS

BACKGROUND OF THE INVENTION (1) Field of the Invention

The present invention relates to semiconductor devices, and more specifically to a process for fabricating high density dynamic random acess memory, (DRAM), devices.

(2) Description of Prior Art

A major criteria for high density dynamic random access memory, (DRAM), devices, is the ability of the storage node of this device, to supply the desired capacitance needed for circuit performance. The basic DRAM memory cell is usually comprised of a transfer gate transistor and a connected capacitor. Charges are stored in the capacitor section of the DRAM, and are accessed via the transfer gate transistor. The ability to densely pack storage cells, while maintaining sufficient stored charge, is a function of the type and structure of the capacitor section of the DRAM. One method, used in the industry, for capacitors is the "stacked storage cell" design. In this design two conductive layers, such as polycrystalline silicon, are placed over a section of the transfer gate transistor, with a dielectric layer sandwiched between the polycrystalline layers. Cells constructed in this manner are referred to as stacked capacitor cells, (STC).

As DRAM densities increase, resulting in smaller device dimensions, the ability to maintain adequate capacitance using the STC structure becomes difficult. The shrinking dimensions of the transfer gate transistor limits the dimensions of the capacitor plates, thus severely limiting the ability to maintain the capacitance needed to operate the DRAM. Alternatives for maintaining signal, capacitance, include decreasing the thickness of the dielectric layer of the STC structure. However it is difficult to decrease the dielectric material much below about 100 Angstroms, in silicon dioxide equivalent, without raising yield concerns. Therefore the industry has attempted to maintain capacitance by increasing the area of the conductive plates, even when the underlying access area, transfer gate transistor region, is decreasing in dimension. This is accomplished by a process producing concaves and convexes on the surface of the lower electrode, thus creating increased surface area, without increasing the overall dimension of the DRAM cell. In U.S. Pat. No. 5,290,729, Hayashide, etal, describe a process for producing roughened storage node layers of polycrystalline silicon by using specific deposition conditions and subsequent POCl3 and oxidation processes. Also Fazen, etal, in U.S. Pat. 5,278,091, describe a different form of roughened polysilicon, used for the storage node. However in the invention now disclosed the level of roughness, needed to adequately complement the decreasing DRAM cell dimension, is dramatically increased via specific and unique processing methods.

SUMMARY OF THE INVENTION

It is an object of this invention to provide a method of fabricating DRAM devices using a stacked capacitor structure.

It is another object of this invention to use a capacitor in which the lower electrode is a polycrystalline silicon material.

It is yet another object of this invention to use a roughened surface, polycrystalline silicon, lower electrode, for purposes of increasing the surface area of the lower electrode, and thus increase the capacitance of the DRAM device.

In accordance with the present invention a method is described for fabrication of a DRAM device, using a stacked capacitor structure, in which the lower electrode or storage node, is fabricated using a roughened surface polycrystalline silicon layer. The method consists of initially providing a transfer gate transistor, fabricated using conventional metal oxide semiconductor field effect transistor, (MOSFET), processing. The transfer gate transistor comprises N+ source and drain areas formed in the surface of a P type silicon substrate. A thin gate oxide is formed at the silicon substrate surface between the N+ regions, and a gate electrode, fabricated from polycrystalline silicon, is formed on the gate oxide. The gate electrode forms a portion of the DRAM word line and passivated with a first insulating layer. An area in an N+ region is exposed, by an opening in the first insulator layer, for contact to the subsequent overlying stacked capacitor. The stacked capacitor is formed by initially creating the lower electrode, or storage node, from a polycrystalline silicon layer grown at specific deposition conditons, and annealed insitu, initially in nitrogen, and followed by insitu vacuum annealing. This process creates a hemispherical grained, (HSG), polycrystalline silicon surface, which increases the storage node surface area. Next a thin dielectric layer, oxidized nitride on silicon oxide, (ONO), is grown on the roughend or HSG storage node. Then a second deposition of polycrystalline silicon, using conventional deposition techniques, is performed for purposes of subsequently creating the upper electrode or cell plate of the stacked capacitor structure. After patterning, using standard photolithographic and reactive ion etching, (RIE), processing, to create the desired stacked capacitor configuration, a second insulator is deposited. Contact holes, through the second insulator and to an N+ bit line, are formed, followed by deposition of a metal layer and subsequent patterning, thus completing the DRAM device with the optimized storage node.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming DRAM devices, with optimized storage node capacitor properties, will now be described in detail. Conventional DRAM stacked capacitor structures are currently being manufactured in industry, therefore only the specific areas unique to understanding this invention will be described in detail.

Figure 1:
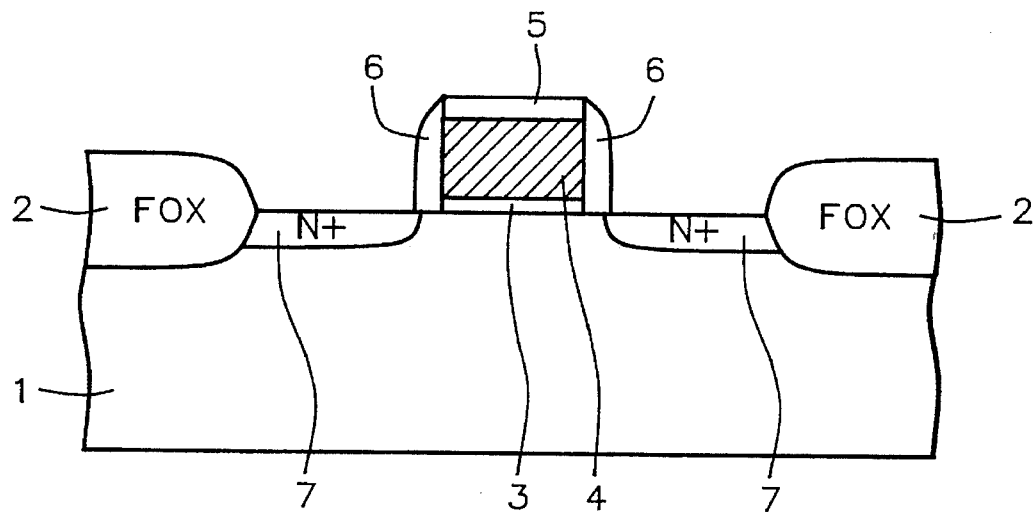
FIG. 1, which schematically shows in cross-sectional form, the transfer gate transistor section of the DRAM device.
Figure 2:
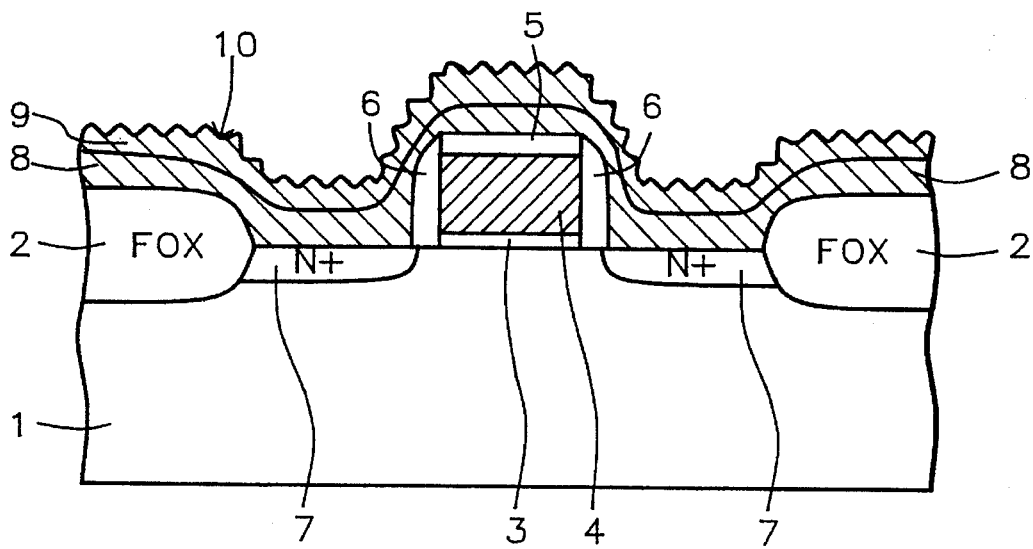
FIGS. 2–5, which are cross-sectional views showing the fabrication steps used with a first embodiment of the invention, used to create the stacked capacitor portion of the DRAM device.

FIG. 1 schematically shows a transfer gate transistor, fabricated for use in this invention as part of the DRAM cell. Briefly a substrate, 1, composed of P type, single crystal silicon, with a <100> crystalline orientation, is used. A field oxide region, 2, is formed in the surface of the substrate. This is accomplished by creating an oxidation mask of a thin thermal oxide, followed by a low pressure chemical vapor deposition, (LPCVD), of a thin layer of silicon nitride. After photolithographic and RIE processing, used to create the desired mask image, and the removal of the masking photoresist from the non-device regions, a field oxide, 2, is grown at a temperature between about 950° to 1050° C., in a steam ambient, to a thickness between about 4000 to 6000 Angstroms. After removal of the oxidation masking silicon nitride—silicon dioxide region, in hot phosphoric acid for silicon nitride removal, and a buffered hydrofluoric acid solutuion for the silicon dioxide, a thin gate silicon dioxide film, 3, is grown in an oxygen—steam ambient, at a temperature between about 850° to 950° C., to a thickness between about 100 to 300 Angstroms. Next an in-situ doped polysilicon film, 4, is deposited, using LPCVD techniques, at a temperature between about 550° to 650° C., to a thickness between about 2000 to 4000 Angstroms, using $SiH_4$ and $PH_3$.

A layer of silicon oxide, 5, is deposited, again using LPCVD techniques, to a thickness between about 1000 to 3000 Angstroms. Standard photolithographic and RIE processing, is then performed to create the polysilicon gate electrode, 4, shown in FIG. 1. The RIE processing includes the silicon oxide etch using $CHF_3$, followed by the silicon RIE step, performed in HBr and $Cl_2$. After photoresist removal and careful wet chemical cleans another insulator layer, 6, of silicon oxide is deposited via LPCVD deposition, and subjected to an anisotropic RIE procedure in $CHF_3$, to create the sidewall spacer in insulator, 6. Self-aligned source and drain regions, 7, are created via ion implantation of arsencic at a energy between about 50 to 100 Kev., at a dose between about 1E14 to 5E15 atoms/cm2.

FIGS. 2–5, schematically illustrates the fabrication steps used for a first embodiment of this invention. The critical polysilicon deposition and annealing processes, used to create the storage node of the stacked capacitor structure, are first performed. The objective of the polysilicon process is to achieve a surface in which large concave and convex protrusions are produced, thus resulting in a significant increase in surface area. This has been achieved and shown in FIG. 2, as layers 8 and 9. First, a polysilicon layer, 8, is in-situ grown, using LPCVD processing at a temperature between about 550° to 600° C., to a thickness between about 3500 to 4500 Angstroms. Layer 8, is deposited using a $SiH_4$ flow of between about 800 to 1300 sccm and a $PH_3$ flow between about 50 to 150 sccm. Next another thin layer of polysilicon, 9, is grown at a temperature between about 540° to 600° C., and at a deposition pressure of about 0.2 Torr, using $Si_2H_6$ at a flow between about 50 to 600 sccm. The thickness of the deposited polysilicon is between about 400 to 1500 Angstroms. Next the temperature in the polysilicon deposition chamber is ramped up to a temperature between about 610° to 630° C., to allow the structure to experience an anneal, at this temperature, in an $N_2$ flow of between 10 to 20 sccm, for a time between about 5 to 15 min. The $N_2$ flow is then turned off, and a pressure of between about 0.03 to 0.09 Torr is produced, to allow an additional vacuum anneal to be performed, for a time between about 10 to 30 min. These specific polysilicon deposition, and anneal conditions, result in a hemispherical grained surface, 10, with the concave and convex protrusions resulting in about a two times increase in surface area. It should be noted that during the deposition of layer 9, and the subsequent annealing step, doping of the layer 9 was accomplished via phosphorous diffusion from underlying insitu doped polysilicon layer, 8.

Figure 3:
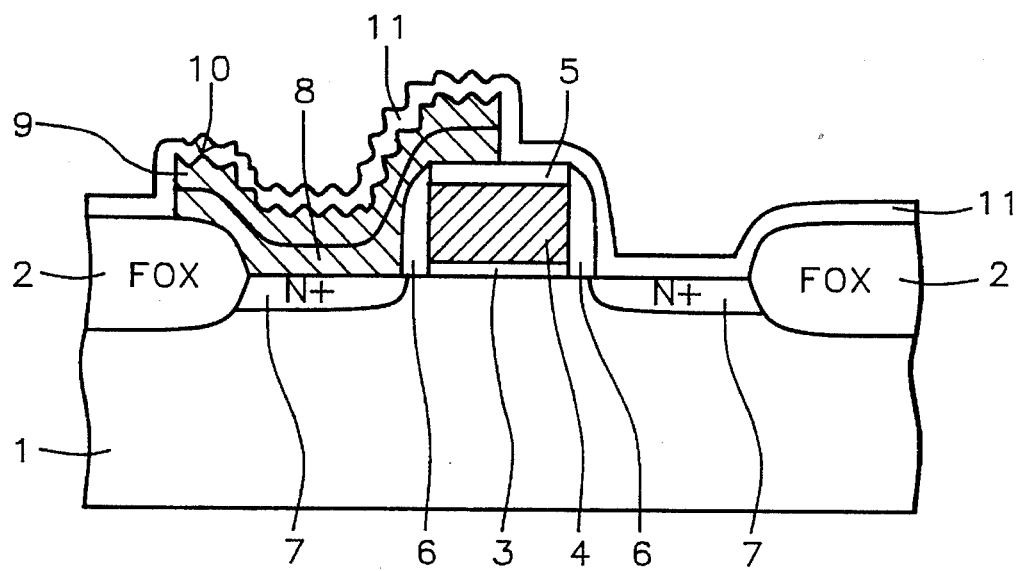

The next stage of fabrication is shown in FIG. 3. Standard photoresist processing is used to create the desired storage node image in photoresist and then transferred to the underlying polysilicon layers, 8 and 9, via RIE procedures using HBr and $Cl_2$, to form the desired storage node, or lower electrode polysilicon. After removal of the masking photoresist, and careful wet cleans, a critical dielectric layer, 11, is grown. A composite layer of oxynitride—nitride—oxide, (ONO), is used at an equivalent silicon dioxide thickness of between about 50 to 80 Angstroms. The ONO layer is achieved by initially growing silicon oxide on the underlying polysilicon layer, 9, using a SPM—steam ambient, at a temperature between about 100° to 130° C., with the oxide grown to a thickness of between about 8 to 15 Angstroms. Next a thin layer of silicon nitride is deposited using LPCVD techniques, at a temperature between about 650° to 750° C., to a thickness between about 50 to 80 Angstroms. Finally the structure is subjected to a O2—steam envirnoment, at a temperature between about 850° to 900° C., for about 30 min., for purposes of converting the surface of the silicon nitride layer to a silicon oxynitride surface. Thus the formation of the ONO layer, 11, is complete, and its conformality with the underlying HSG polysilicon surface, 10, can be seen in FIG. 3.

Figure 4:
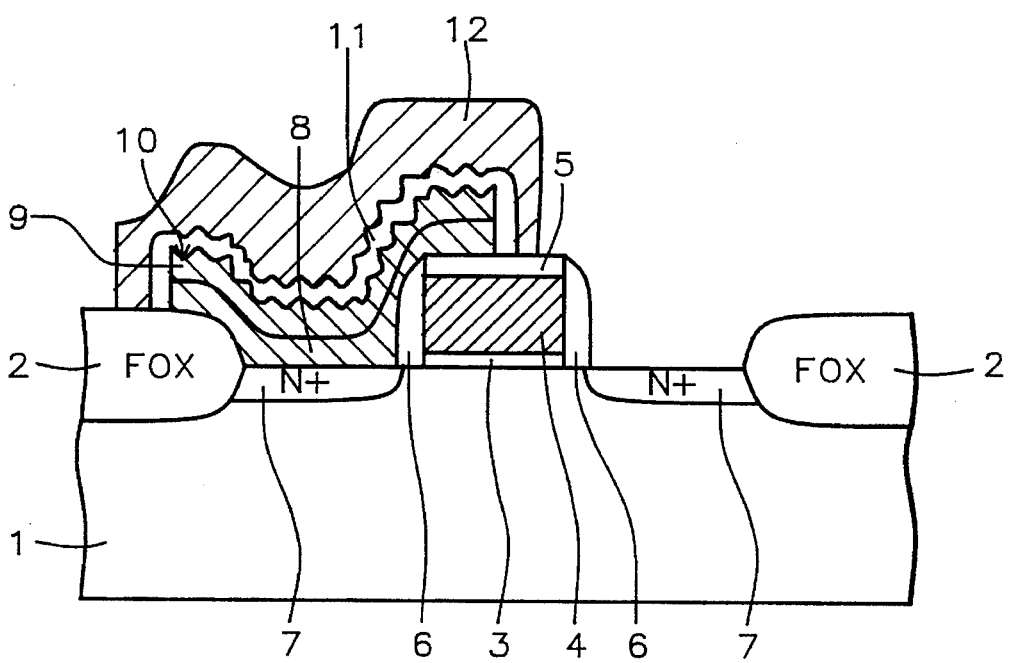
Figure 5:
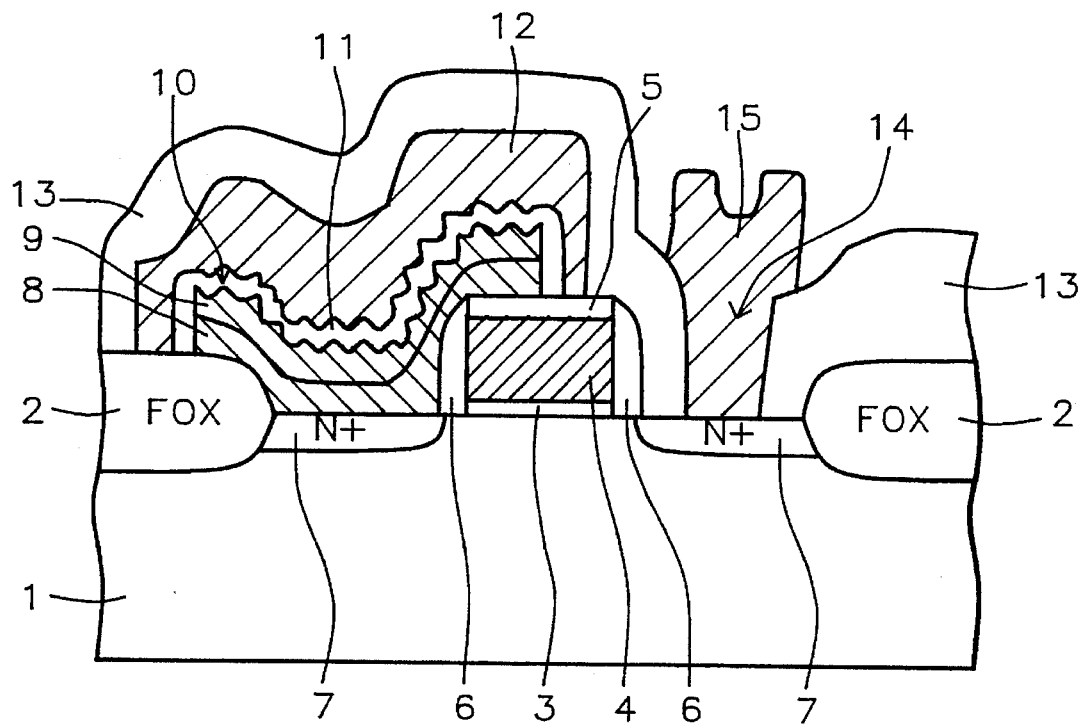

FIG. 4 shows the creation of the upper electrode or cell plate, again fabricated from polysilicon material. A polysilicon deposition is carried out, using LPCVD techniques, at a temperature between about 550° to 600° C., to a thickness between about 500 to 2000 Angstroms. This is shown as layer, 12, in FIG. 4. This deposition is performed intrinsically using $SiH_4$, and is doped via conventional ion implantation processes using phosphorous. Again standard photoresist processing is used to obtain the desired upper electrode image in photoresist, and transferred to the underlying polysilicon layer, 12, via RIE using HBr and $Cl_2$. This is shown schematically in FIG. 4.

A insulator layer, silicon oxide, 13, is deposited using LPCVD, at a temperature between about 650° to 750° C., to a thickness between about 500 to 2000 Angstroms. Standard photolithographic procedures, followed by RIE processing, is used to open a via, 14, to a N+ region, 7. Metallization, using Al—Cu—Si is deposited and patterned to form metal contact, 15, shown schematically in FIG. 5. The metallization is deposited to a thickness between about 3000 to 5000 Angstroms, and patterned by RIE procedures, using $Cl_2$. This completes the first embodiment of this process used to produce optimized stacked capacitor structures.

Figure 6:
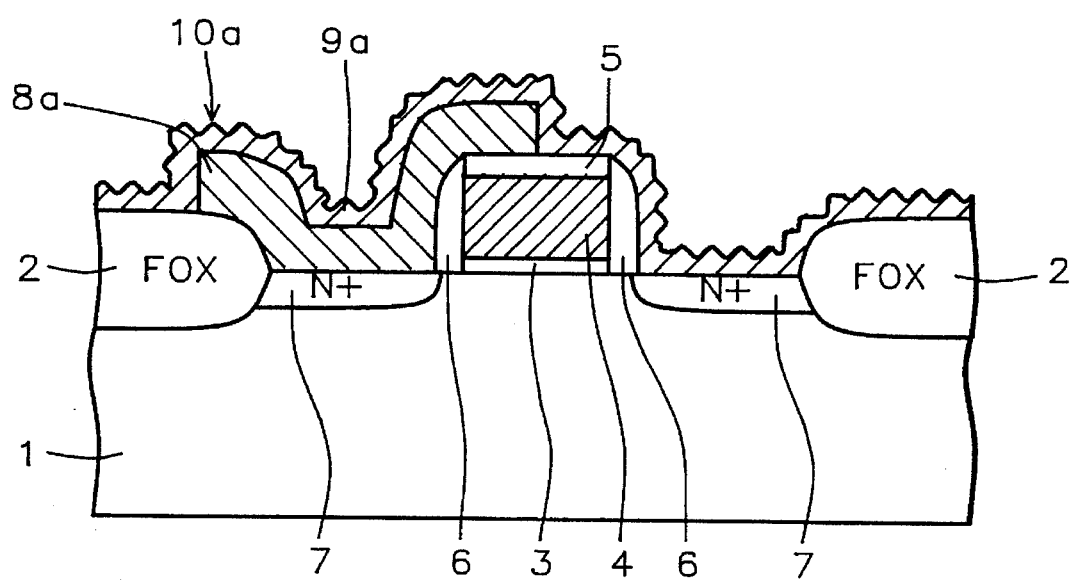
FIGS. 6–7, which illustrate in cross-sectional form, a second embodiment of the invention, used to create the stacked capacitor portion of the DRAM device.
Figure 7:
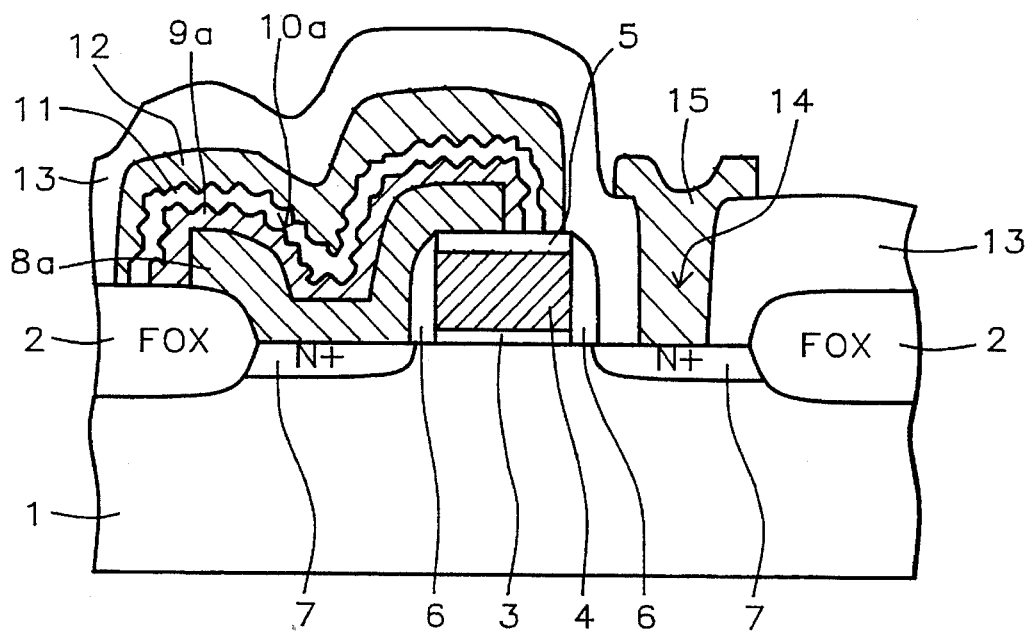

A second embodiment of this invention is described in FIGS. 6–7. After completion of the transfer gate transistor structure, a conventional polysilicon deposition is performed. The polysilicon film produced, shown as layer 8a, in FIG. 6, is grown using identical conditions to those previously described for polysilicon layer 8. Again in-situ deposition is performed using $SiH_4$ as the polysilicon source and $PH_3$ for the dopant source. The deposition occurs at a temperature between about 550° to 600° C., to a thickness between about 3500 to 4500 Angstroms. For this iteration polysilicon layer, 8a, will now be patterned. In the previous iteration patterning of the storage node was accomplished on both polysilicon layer 8, and the polysilicon layer 9, containing the HSG surface, using one RIE procedure. Polysilicon layer 8a is now subjected to photoresist and RIE procedures, again identical to procedures performed on layer 8, in the previous embodiment, to produce structure 8a, shown in FIG. 6. After photoresist removal, followed by careful wet cleans, an additional deposition of polysilicon layer 9a is performed. The deposition conditions used and subsequent annealing procedures employed, are identical to the conditions used in the first embodiment, that resulted in the HSG surface, 9. The deposition is performed using $Si_2H_6$, at a flow between about 50 to 600 sccm, at a temperature between about 540° to 600° C., at a pressure of about 0.2 Torr, to produce a polysilicon layer between about 400 to 1500 Angstroms. Next the temperature is ramped up 20° to 80° C., in a N2 flow of about 20 sccm, for a time of about 10 min. Finally the N2 flow is stopped and a vacuum of between 0.03 to 0.09 Torr is produced and the structure experiences these conditions for an additional 10 min. to produce a HSG surface, 10a, on polysilicon layer 9a. It can be seen that in this embodiment, the amount of surface area available for concave and convex protrusions, is even greater then surface area increases shown in the first embodiment, due to coverage of the sidewall of structure 8a, and thus even greater increases in capacitance can be realized via use of this second embodiment.

FIG. 7, illustrates the completion of the stacked capacitor structure, using the optimized storage node, described in the second embodiment. Again an ONO layer, 11, is used, followed by the deposition of the upper electrode polysilicon, 12. Ion implantation procedures are used to dope the blanket polysilicon layer, 12, followed by patterning procedures used to create the desired upper electrode configuration. These conditions are identical to conditions used for the first embodiment. However with the second embodiment the RIE procedure, used to create the upper electrode configuration, concludes with an overetch which removes the residual HSG layer, 9a, from non-capacitor regions. Insulator deposition, patterning and metallization complete the stacked capacitor structure, illustrated in this second embodiment.

Figure 8:
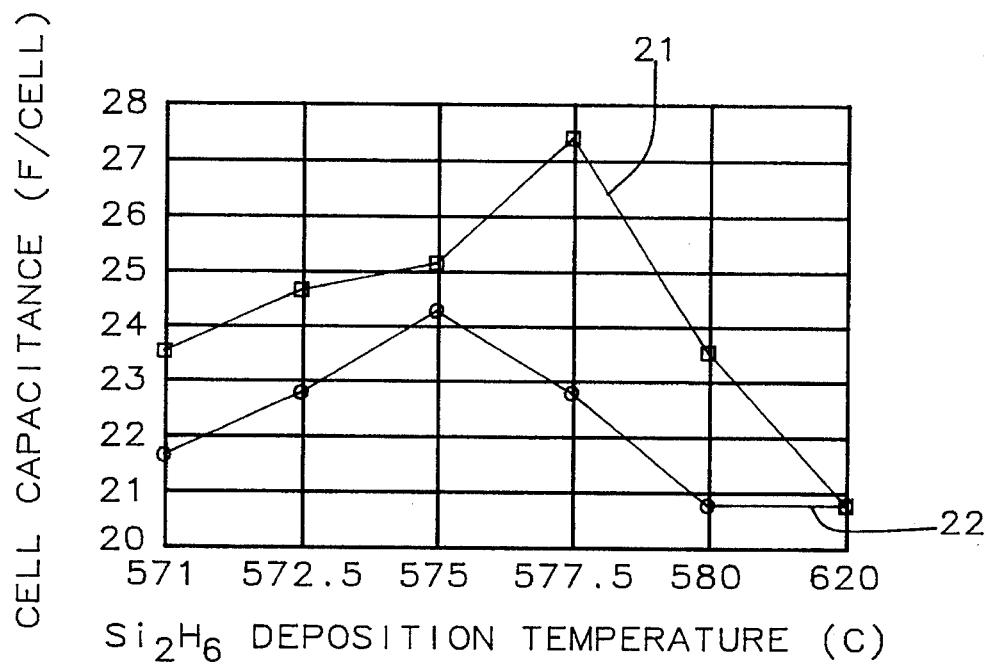
FIG. 8, graphically showing cell capacitance, as a function of deposition temperature, for both single and double layered polysilicon films.

FIG. 8 shows the benefit of this invention. Cell capacitance, influenced by the surface area of the polysilicon structure, is shown as a function of deposition temperature of $Si_2H_6$ grown polysilicon. First, it can be seen that the cell capacitance starts to decrease with deposition temperatures above about 577° C. This is due to the inability to grow HSG at these increased tempertaures. It should also be observed that this invention which features a two layered polysilicon structure, shown as 21, in FIG. 8, in which the upper layer is doped via outdiffusion from a lower, insitu-doped polysilicon layer, results in higher cell capacitance, or a greater degree of HSG, than counterparts fabricated using a single layer HSG polysilicon, shown as 22, in FIG. 8, doped using conventional ion implantation procedures.

This process, an optimized process for DRAM storage node capacitors, although shown for N type, (NFET), DRAMs, can also be applied to PFET DRAMs as well.

While this invention has been particularly shown and described with reference to, the preferred embodiments thereof, it will be understood by those skilled in the art that various changes in form and details may be made without departing from the scope and spirit of this invention.

What is claimed is:

1. A method for fabricating stacked capacitor, dynamic random access memory, (DRAM), devices, on a semiconductor substrate, comprising the steps of:

providing a transfer gate transistor in said substrate;

depositing an in-situ doped first polysilicon layer, on said transfer gate transistor;

depositing a second polysilicon layer on said in-situ doped first polysilicon layer;

annealing of said in-situ doped first polysilicon layer, and said second polysilicon layer in nitrogen ambient followed by an in-situ vacuum annealing, to increase roughness of top surface of said second polysilicon layer, and drive dopant from said in-situ doped first polysilicon layer into said second polysilicon layer;

patterning of said in-situ doped first polysilicon layer, and said second polysiliocn layer to form lower capacitor electrode structure;

formation of composite dielectric layer on said lower capacitor electrode structure, and on said transfer gate transistor, not covered by said lower electrode structure;

depositing a third polysilicon layer on said composite dielectric layer;

ion implanting a first conductivity imparting dopant into said third polysilicon layer;

patterning of third polysilicon layer to form upper electrode structure;

depositing an insulator layer on said upper electrode structure, and on said transfer gate transistor, not covered by said upper electrode structure;

opening a contact hole in said insulator layer, to a region in said transfer gate transistor; and forming a metal land in said contact hole.

2. The method of claim 1, wherein said transfer gate transistor is an N type field effect transistor, with a gate oxide of between about 80 to 170 Angstroms.

3. The method of claim 1, wherein said in-situ doped first polysilicon layer is grown using $SiH_4$, at a flow of between about 800 to 1300 sccm, and $PH_3$, at a flow between about 50 to 150 sccm, at a temperature between about 550° to 600° C., to a thickness between about 3500 to 4500 Angstroms.

4. The method of claim 1, wherein said second polysilicon layer is grown using $Si_2H_6$ at a flow between about 50 to 600 sccm, at a temperature between about 540° to 600° C., at a pressure of about 0.2 Torr, deposited to a thickness between about 400 to 1500 Angstroms.

5. The method of claim 1, wherein said in-situ doped first polysilicon layer, and said second polysilicon layer, are insitu annealed in N2, at a flow between about 10 to 20 sccm, at a temperature between about 610° to 630° C., for between about 5 to 15 min., and then in-situ vacuum annealed at a pressure of about 0.03 to 0.09 Torr, at a temperature between about 610° to 630° C., for a time between about 10 to 30 min.

6. The method of claim 1, wherein said in-situ doped first polysilicon layer, and said second polysilicon are patterned by RIE processing, using HBr and Cl2, to form said lower electrode structure.

7. The method of claim 1, wherein said composite dielectric layer is composed of silicon oxynitride—silicon nitride—silicon dioxide, obtained by: SPM oxidation, at a temperature between about 100° to 130° C., to a thickness between about 8 to 15 Angstroms; deposition of a silicon nitride layer, using LPCVD processing, at a temperature between about 650° to 750° C., to a thickness between about 50 to 80 Angstroms; and an oxidation of said silicon nitride layer, at a temperature betweenabout 850° to 900° C., in an oxygen—steam ambient, to form between about 10 to 30 Angstroms of silicon oxynitride.

8. The method of claim 1, wherein said third polysilicon layer is deposited, using SiH4, at a temperature between about 550° to 600° C., to a thickness between about 500 to 2000 Angstroms.

9. The method of claim 1, wherein said first conductivity imparting dopant is phosphorous, ion implanted at an energy between about 30 to 60 Kev., at a dose between about 5E14 to 5E15 atoms/cm2.

10. The method of claim 1, wherein said third polysilicon layer is patterned by RIE processing, using HBr and Cl2, to form upper electrode structure.

11. A method for fabricating stacked capacitor, dynamic random access memory, (DRAM), devices, on a semiconductor substrate, comprising the steps of:

providing a transfer gate transistor in said substrate;

depositing an in-situ doped first polysilicon layer on said transfer gate transistor;

patterning of said in-situ doped first polysilicon layer to form lower capacitor electrode structure;

depositing a second polysilicon layer, having a roughened top surface, on said lower capacitor electrode structure, and on regions not covered by said lower electrode structure;

annealing of said in-situ doped first polysilicon layer, and said second polysilicon layer in nitrogen ambient followed by an in-situ vacuum annealing, to increase roughness of top surface of said second polysilicon layer, and to drive dopant from said insitu doped first polysilicon layer into said second polysilicon layer;

formation of a composite dielectic layer on said second polysilicon layer;

depositing a third polysilicon layer on said composite dielectric layer;

ion implanting a first conductivity imparting dopant into said third polysilicon layer;

patterning of said third polysilicon layer to form upper capacitor electrode structure;

depositing an insulator layer on said upper capacitor electrode structure, and on regions of said transfer gate transistor, not covered by said upper electrode structure;

opening a contact hole in said insulator layer, to a region in said transfer gate transistor; and forming metal land in said contact hole.

12. The method of claim 11, wherein said transfer gate transistor is an N type, field effect transistor, with a gate oxide of between about 80 to 170 Angstroms.

13. The method of claim 11, wherein said in-situ doped first polysilicon layer is grown using SiH4, at a flow between about 800 to 1300 sccm, and PH3 at a flow between about 50 to 150 sccm, at a temperature between about 550° to 600° C., to a thickness between about 3500 to 4500 Angstroms.

14. The method of claim 11, wherein said in-situ doped first polysilicon layer is patterned by RIE processing, using HBr and Cl2 to form lower electrode structure.

15. The method of claim 11, wherein said second polysilicon layer is grown using Si2H6, at a flow between about 50 to 600 sccm, and N2 at a flow of about 350 sccm, at a temperature between about 540° to 600° C., to a thickness between about 400 to 1500 Angstroms.

16. The method of claim 11, wherein said in-situ doped first polysilicon layer, and said second polysilicon layers are in-situ annealed in N2, at a flow between about 10 to 20 sccm, at a temperture between about 610° to 630° C., for a time between about 5 to 15 min., and then in-situ vacuum annealed at a pressure of about 0.03 to 0.09 Torr, at a temperature between about 610° to 630° C., for a time between about 10 to 30 min.

17. The method of claim 11, wherein said composite dielectric layer is composed of silicon oxynitride—silicon nitride—siliicon dioxide, obtained by: SPM oxidation of said second polysilicon layer, at a temperature between about 100° to 130° C., to a thickness between about 8 to 15 Angstroms; deposition of a silicon nitride layer, using LPCVD processing, at a temperature between about 650° to 750° C., to a thickness between about 50 to 80 Angstroms; and an oxidation of said silicon nitride layer, at a temperature between about 850° to 900° C., in an oxygen—steam ambient, to form between about 10 to 30 Angstroms of silicon oxynitride.

18. The method of claim 11, wherein said third polysilicon layer is deposited at a temperature between about 550° to 600° C., to a thickness between about 500 to 2000 Angstroms.

19. The method of claim 11, wherein said first conductivity imparting dopant is phosphorous, ion implanted at an energy between about 30 to 60 Kev., at a dose between about 5E14 to 5E15 atoms/cm2.

20. The method of claim 11, wherein said third polysilicon layer is patterned by RIE processing, using HBr and Cl2, to form upper electrode structure.

* * * * *